(12) United States Patent
Nitzberg et al.

(10) Patent No.: US 8,768,563 B2
(45) Date of Patent: Jul. 1, 2014

(54) ELECTRIC VEHICLE SUPPLY EQUIPMENT TESTING APPARATUS

(75) Inventors: Jason-David Nitzberg, Maryville, TN (US); Phillip J. Speeks, Knoxville, TN (US); Matthew S. Piers, Knoxville, TN (US); Paul D. Seff, Williamsburg, VA (US); Jonathan K. Hamilton, Williamsburg, VA (US)

(73) Assignee: Eaton Corporation, Cleveland, OH (US)

( * ) Notice: Subject to any disclaimer, the term of this patent is extended or adjusted under 35 U.S.C. 154(b) by 56 days.

(21) Appl. No.: 13/356,707

(22) Filed: Jan. 24, 2012

(65) Prior Publication Data

US 2013/0190968 A1 Jul. 25, 2013

(51) Int. Cl.
*G01M 17/00* (2006.01)
*G07C 5/00* (2006.01)
*G07C 3/00* (2006.01)

(52) U.S. Cl.
CPC . *G07C 5/008* (2013.01); *G07C 3/00* (2013.01)
USPC ...................................................... 701/31.6

(58) Field of Classification Search
CPC .................................. G07C 5/008; G07C 3/00
USPC ...................................................... 701/31.6
See application file for complete search history.

(56) References Cited

U.S. PATENT DOCUMENTS

| | | | |
|---|---|---|---|
| 4,550,360 A * | 10/1985 | Dougherty | .................... 361/93.2 |
| 6,225,776 B1 | 5/2001 | Chai | |
| 7,518,840 B2 | 4/2009 | Elms | |
| 2007/0208520 A1* | 9/2007 | Zhang et al. | .................... 702/58 |
| 2009/0040666 A1* | 2/2009 | Elms et al. | ........................ 361/42 |
| 2011/0169447 A1* | 7/2011 | Brown et al. | .................. 320/109 |
| 2011/0172839 A1* | 7/2011 | Brown et al. | .................. 700/292 |
| 2011/0216452 A1 | 9/2011 | Haines et al. | |
| 2011/0320056 A1* | 12/2011 | Brown et al. | .................. 700/295 |
| 2013/0201641 A1* | 8/2013 | Soden et al. | .................... 361/752 |

FOREIGN PATENT DOCUMENTS

WO 2011/127446 A2 10/2011

OTHER PUBLICATIONS

Gridtest Systems, "EV Emulator Tool EVE-100J", 2011, 2pp.
Gridtest Systems, "Electrical Vehicle Service Equipment Test Kit / EVSE Safety Test / Gridtest Systems", http:// www.gridtest.com/solutions/, 2011, 3 pp.
Smith, Dottie Hanan, "Worlds First Independent Test Tool for EV Charging Stations / My Blog", http://automotivediscovery.com/worlds-first-independent-test-tool-for-ev-charging-stations/929512/, Jul. 19, 2011, 3 pp.

(Continued)

*Primary Examiner* — Behrang Badii
*Assistant Examiner* — Daniel L Greene
(74) *Attorney, Agent, or Firm* — Eckert Seamans Cherin & Mellott, LLC; Kirk D. Houser (57) ABSTRACT

A test apparatus is for electric vehicle supply equipment. The test apparatus includes an enclosure; a processor; and an interface to at least the electric vehicle supply equipment. The processor is structured to test that the electric vehicle supply equipment is functioning properly and to provide at least one of: a number of causes of failure of the electric vehicle supply equipment, an indication of how to correct the failure, automatic correction of the failure, and predictive maintenance of the electric vehicle supply equipment prior to a failure thereof.

20 Claims, 7 Drawing Sheets

(56) References Cited

OTHER PUBLICATIONS

Gridtest Systems, "gridtestsystems", http://www.gridtest.com/products/, 2012, 3 pp.

SAE International, EVSE automated test system—Vehicle Electrification—SAE, http://ev.sae.org/article/9836, 2012, 2 pp.

Chroma Systems Solutions, Inc., "Product Focus: Chroma's EVSE Automated Test System", Power Test Instruments & Systems, http://www.chromausa.com/blog/ev-phev/product-focus-chromas-evse-automated-test-system/, 2009-2012, 2 pp.

Control Module Industries, "Learned Lesson for Future Deployment", Control Module Industries EVSE LLC Presentation to EDTA 2011 Conference & Annual Meeting, 2011, 12 pp.

Canadian Leaf, "Blogging the life of a Nissan Leaf in Canada", http://canadianleaf.wordpress.com/page/2/, 2011, 10 pp.

SAE International, "J1772 Recommended Practice for Conductive Charging of Electric Vehicles", Jan. 2010, pp. 7-17.

European Patent Office, "International Search Report and Written Opinion", Oct. 8, 2013, 10 pp.

\* cited by examiner

ELECTRIC VEHICLE SUPPLY EQUIPMENT TESTING APPARATUS

BACKGROUND

1. Field

The disclosed concept pertains generally to electric vehicle supply equipment and, more particularly, to testing apparatus for such electric vehicle supply equipment.

2. Background Information

An electric vehicle (EV) charging station, also called an EV charging station, electric recharging point, charging point, and EVSE (Electric Vehicle Supply Equipment), is an element in an infrastructure that supplies electric energy for the recharging of electric vehicles, plug-in hybrid electric-gasoline vehicles, or semi-static and mobile electrical units such as exhibition stands.

An EV charging station is device that safely allows electricity to flow. These charging stations and the protocols established to create them are known as EVSE, and they enhance safety by enabling two-way communication between the charging station and the electric vehicle.

The 1996 NEC and California Article 625 define EVSE as being the conductors, including the ungrounded, grounded, and equipment grounding conductors, the electric vehicle connectors, attachment plugs, and all other fittings, devices, power outlets or apparatus installed specifically for the purpose of delivering energy from premises wiring to an electric vehicle.

EVSE is defined by the Society of Automotive Engineers (SAE) recommended practice J1772 and the National Fire Protection Association (NFPA) National Electric Code (NEC) Article 625. While the NEC defines several safety requirements, J1772 defines the physical conductive connection type, five pin functions (i.e., two power pins (Hot1 and Hot2 or neutral), one ground pin, one control pilot pin, and one proximity pin), the EVSE to EV handshake over the pilot pin, and how both parts (EVSE and EV) are supposed to function. Currently, however, EVSE does not have a mechanism to check its proper function without an EV present to test the function of the EVSE and complete the J1772 pilot circuit.

Two-way communication seeks to ensure that the current passed to the EV is both below the limits of the EV charging station itself and below the limits of what the EV can receive. There are additional safety features, such as a safety lock-out, that does not allow current to flow from the EV charging station until the EV connector or EV plug is physically inserted into the EV and the EV is ready to accept energy.

J1772 in North America and IEC 61851 standard use a very simple but effective pilot circuit and handshake in the EVSE. For charging a vehicle using alternating current (AC), basically a signal is generated on the pilot pin 4 of FIG. 1, 12 Vdc open circuit when measured to ground pin 3. When the EVSE cable and connector 10 is plugged into an EV inlet 11 of a compliant vehicle 12, the vehicle's circuit has a resistor 14 and a diode 16 in series that ties to ground 18 in order to drop the 12 Vdc to 9 Vdc. After the EVSE 20 sees this drop in voltage, it turns on a pulse-width modulated (PWM) generator 22 that defines the maximum available line current (ALC) on the charging circuit. The vehicle charge controller 24 reads the percentage of the duty cycle of the PWM signal, which is equivalent to a certain amperage, and sets the maximum current draw on the onboard vehicle rectifier/charger 26, in order to not trip an upstream circuit interrupter (not shown). The vehicle 12, in turn, adds another resistor 28 in parallel with the resistor 14 of the vehicle's resistor and diode 14,16 series combination, which then drops the top level of the PWM pilot signal to 6 Vdc. This tells the EVSE 20 that the vehicle 12 is ready to charge. In response, the EVSE 20 closes an internal relay/contactor 30 to allow AC power to flow to the vehicle 12.

It is believed that manufacturers of EVSE, understanding J1772, have built test boxes to simulate the function of an EV to test EVSE during development, since vehicles are scarce and relatively very expensive compared to charging equipment. These test boxes allow for testing that the EVSE is functioning properly by simulating the circuit on board the EV. However, these simple test fixtures are separate, portable devices (representing the vehicle) and they are simply designed to check functionality and compliance of the EVSE.

There is room for improvement in electric vehicle supply equipment testing apparatus.

SUMMARY

These needs and others are met by embodiments of the disclosed concept, which provide diagnostic and health check monitors for electric vehicle supply equipment (EVSE). Rather than measuring how far a certain parameter is from a nominal value and providing a "fail" signal, the disclosed concept evaluates potential causes of failed parameters based on experience and statistical calculations of indirect parameters to explain how to fix the problem, automatically fixes the problem, or provides predictive maintenance. This allows a non-expert to be warned, to use the results in an intelligent fashion, or to fix the EVSE.

The disclosed EVSE test apparatus can be integrated in other parts of the system other than as part of a separate enclosure. For example, the EVSE test apparatus can be integrated into the EVSE as an integrated full system self-test function, in a dock that holds the EVSE cable and connector for safe storage, in the upstream protective device for the EVSE, in an add-on/proxy device to the J1772 connector between EVSE and EV, or in the EV itself.

The disclosed concept allows the EVSE test apparatus to use simplified artificial intelligence that both combines information from multiple tests and feedback from the user of the actual problem in a closed loop system to make the next recommendation better. These same local test systems can be combined by a network to create a larger, more intelligent system.

In accordance with aspects of the disclosed concept, a test apparatus for electric vehicle supply equipment comprises: an enclosure; a processor; and an interface to at least the electric vehicle supply equipment, wherein the processor is structured to test that the electric vehicle supply equipment is functioning properly and to provide at least one of: (1) a number of causes of failure of the electric vehicle supply equipment, (2) an indication of how to correct the failure, (3) automatic correction of the failure, and (4) predictive maintenance of the electric vehicle supply equipment prior to a failure thereof.

In accordance with another aspect of the disclosed concept, a test apparatus is for electric vehicle supply equipment comprising a relay or contactor, a pulse width modulated generator structured to output a pulse width modulated signal, and a ground fault protective device having calibration settings. The test apparatus comprises: an enclosure; a processor; and an interface to at least the electric vehicle supply equipment, wherein the processor is structured to test that the electric vehicle supply equipment is functioning properly and to provide at least one of: (1) adjustment of the calibration settings upon mis-calibration or failure of the ground fault protective device, (2) predictive maintenance of the relay or contactor, and (3) adjustment of a duty cycle of the pulse width modulated signal as output by the pulse width modulated generator.

In accordance with another aspect of the disclosed concept, a test apparatus is for electric vehicle supply equipment comprising an electric vehicle connector and an electric vehicle cable. The test apparatus comprises: a processor; an interface to at least the electric vehicle supply equipment; and an enclosure enclosing the processor and the interface, wherein the processor is structured to test the electric vehicle supply equipment, and wherein the enclosure further encloses at least one of the electric vehicle connector and the electric vehicle cable.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing hardware logic, device or apparatus.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "vehicle" shall expressly include, but not be limited by, a land vehicle, a marine vehicle, an air vehicle, spacecraft, or another motor vehicle.

As employed herein, the term "land vehicle" shall expressly include, but not be limited by, any land-based vehicles having pneumatic tires, any rail-based vehicles, any maglev vehicles, automobiles, cars, trucks, station wagons, sport-utility vehicles (SUVs), recreational vehicles, construction vehicles, off road vehicles, all-terrain vehicles, farm vehicles, fleet vehicles, motor homes, vans, buses, motorcycles, scooters, mopeds, campers, trailers, or bicycles.

As employed herein, the term "marine vehicle" shall expressly include, but not be limited by, any water-based vehicles, ships, boats, other vessels for travel on water, submarines, or other vessels for travel under water.

As employed herein, the term "air vehicle" shall expressly include, but not be limited by, any air-based vehicles, airplanes, jets, aircraft, airships, balloons, blimps, or dirigibles.

As employed herein, the term "electric vehicle" or "electric drive vehicle" shall mean a vehicle that employs a number of electric motors or traction motors for propulsion. Non-limiting examples include plug-in electric vehicles, plug-in hybrid (e.g., without limitation, electric-gasoline) vehicles, and semi-static/semi-mobile electrical units, such as exhibition stands. An electric vehicle typically includes an on-board rechargeable electricity storage system (RESS), such as a number of batteries.

Figure 2:
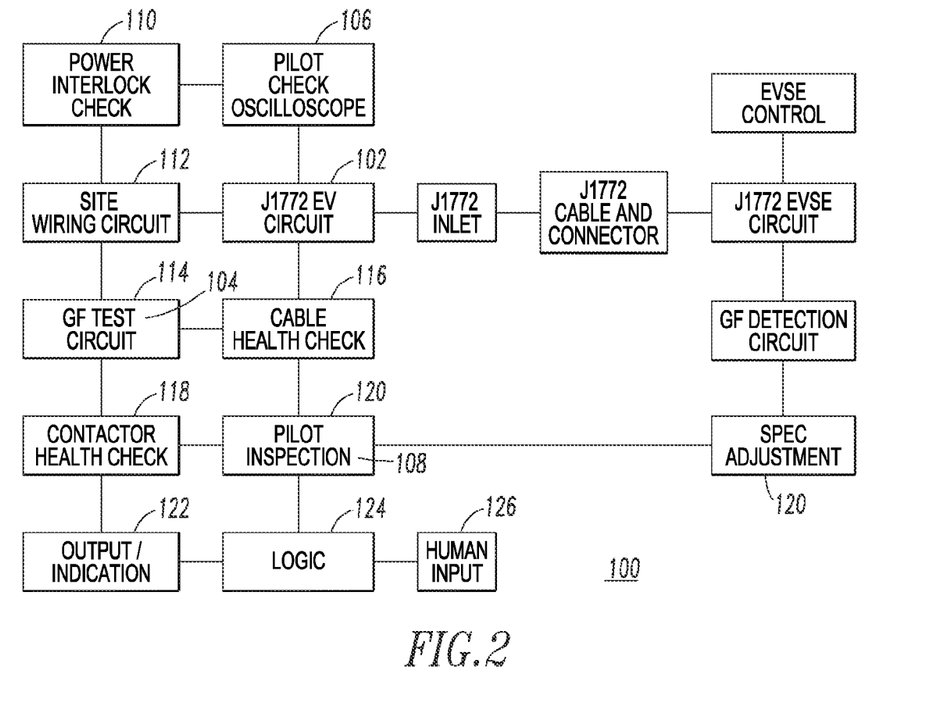
FIG. 2 is a block diagram of an EVSE test circuit in accordance with embodiments of the disclosed concept.
Figure 10:
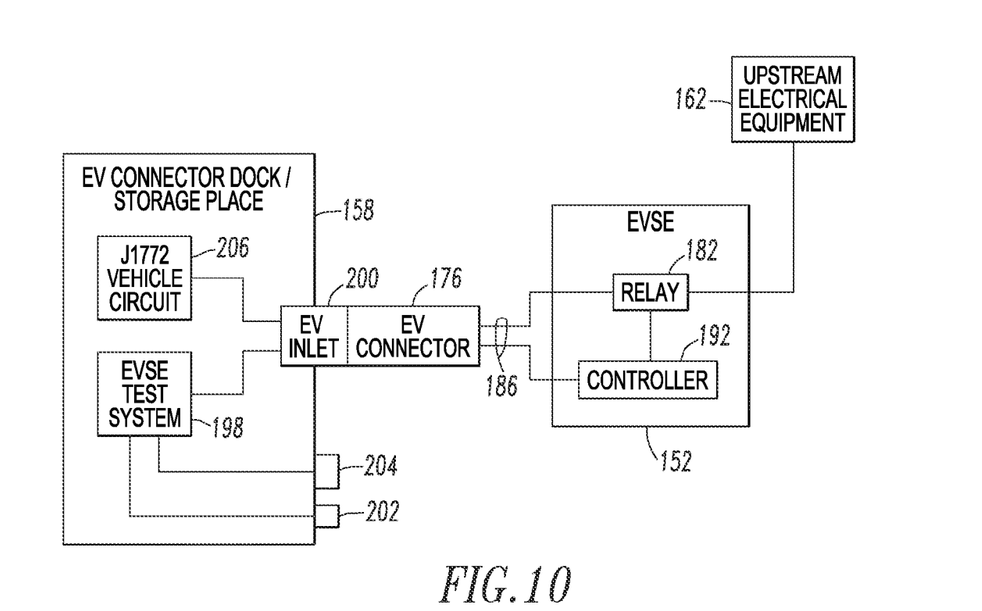
FIG. 10 is a block diagram of an EVSE test apparatus located in the storage place for an EV connector and/or EV cable in accordance with another embodiment of the disclosed concept.

Referring to FIG. 2, an EVSE test circuit 100 is shown. The disclosed concept includes various embodiments of EVSE test apparatus that can contain combinations of a number or all of the following: (1) a J1772 EV circuit 102; (2) an indicator (not shown) for when power is being supplied, i.e. charging; (3) a state switch 164 (FIG. 4) for when a simulated vehicle is ready or not ready for charging; (4) a number of buttons 104 for simulating a ground fault condition; (5) a robust construction enclosure (see, for example, enclosure 157 of FIG. 4) that is tamper resistant; (6) a number of test points 106 for inspecting the pilot circuit handshake with an oscilloscope (not shown); and (7) an indication 108 that shows a parameter's measured value and its deviation from its nominal value.

The disclosed concept further includes various embodiments of EVSE test apparatus that contain a number, some or all of the following: (1) a power interlock check function 110 providing an indication of when a power interlock is or is not implemented based on a state switch 164 (FIG. 4); (2) a site wiring check function 112 for detection and remediation when EVSE or site wiring is incorrect, including: (a) crossed wires (e.g., L1, L2, ground and neutral, if needed), and (b) ground not present; (3) a ground fault (GF) test circuit function 114 providing an indication of ground fault and its relation to incorrect wiring, dirty power or faulty EVSE subcomponents (e.g., current transformers; wiring; GF detection circuit); (4) a cable health check function 116 (e.g., based on cable length; cable impedance; cable capacitance; number of uses of the cable; percentage of ground faults per plug session) for predicting insulation integrity; (5) a contactor/relay health check function 118 (e.g., based on number of uses; resistive and power quality inspection during opening and closing) for predicting when a service/replacement should happen; (6) a pilot inspection function 120 for feedback to the EVSE pilot signal to adjust for component drift (e.g., this could cause an EV to pull more current than allowed by incorrectly reading the PWM signal; internal compensation allows charging to happen but at an apparent lower amperage corresponding to the correct safe amperage of the EVSE/vehicle circuit); (7) placing the EVSE test apparatus in a "dock" and/or storage place 158 (FIG. 10) of the EV connector 176, in order to manually or automatically test every time the EVSE cable/connector is stored properly; (8) an output instructions and conclusions function 122 providing output instructions and conclusions (e.g., employing visual and/or auditory indicators; computer messages; home area network messages; computer programs; on-device; plug-in screen); (9) logic 124 for the EVSE test system 150 (FIG. 3) (e.g., depending on the embodiment, in a local processor; analog circuit; remote networked controller); and (10) human input 126 confirms the accuracy of the output (e.g., feeds into the logic 124 for the next output; can consist of simple yes/no inputs or actual logic adjustment).

Figure 3:
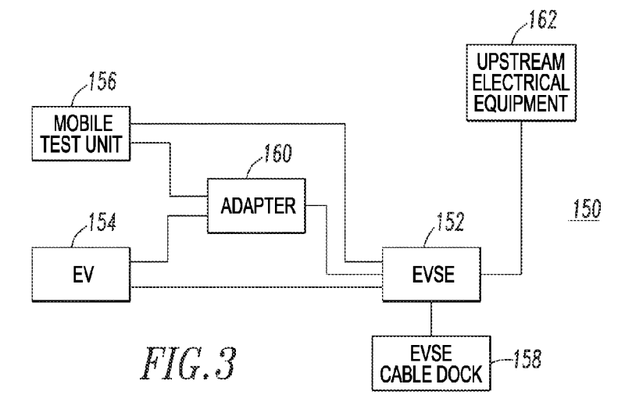
FIG. 3 is a block diagram of an embodiment of an EVSE test apparatus including various alternatives.
Figure 4:
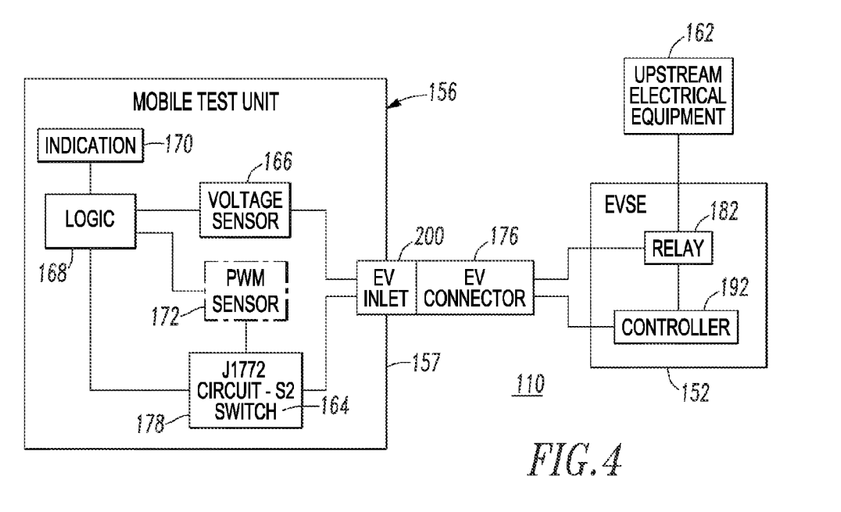
FIG. 4 is a block diagram of the power interlock check function of FIG. 2.

As shown in FIG. 3, the EVSE test apparatus 150 tests that the EVSE 152 is functioning properly by simulating the circuit on board the EV 154. The EVSE test apparatus 150 can employ, for example and without limitation, a relatively small, portable, shippable case, although the EVSE cable dock 158 may be fixed to a wall or fixed to the test apparatus 150 itself Preferably, the test apparatus 150 employs a robust, tamper resistant construction. For engineering tests, the test apparatus 150 may remove the source ground, add extra capacitance, and monitor every point in the EVSE circuit. The EVSE test apparatus 150 can preferably be integrated with a mobile test unit (MTU) 156 and the EVSE cable dock 158, although the EVSE test apparatus 150 can also be part of the EV 154, an adapter 160, the EVSE 152, and/or upstream electrical equipment 162.

FIG. 4 shows the power interlock check function 110 of FIG. 2. This provides an indication of when the power interlock is or is not implemented based on the state switch (S2) 164. By using a number of voltage sensors 166 and knowing what state the "simulated vehicle" is in, the logic 168 determines whether the EVSE 152 has implemented a power interlock. Only when state switch S2 164 (see also switch S2 of the vehicle 12 of FIG. 1) is closed (per J1772) should the EVSE 152 be providing power, which should make the peak voltage on the pilot pin 4 (FIG. 1) be 6 Vdc. Per the 2008 and later NEC, EVSE at 120 Vac, 20 A and below does not require a power interlock; however, all other voltages and currents do require the power interlock. The disclosed logic 168 indicates at indication 170 that the EVSE 152 has failed the power interlock inspection either through non-compliance or other such statistically relevant cause for the data (see human input 126 of FIG. 2). If a 120 Vac, ≤20 A EVSE 152 is connected (as detected by the combination of the voltage sensor 166 and the optional PWM sensor 172 (shown in phantom line drawing)) and the power interlock is enabled, then there is an indication at 170 that the EVSE 152 exceeds requirements and is safer.

Example 1

One example of the logic 168 of FIG. 4 is as follows.

Figure 1:
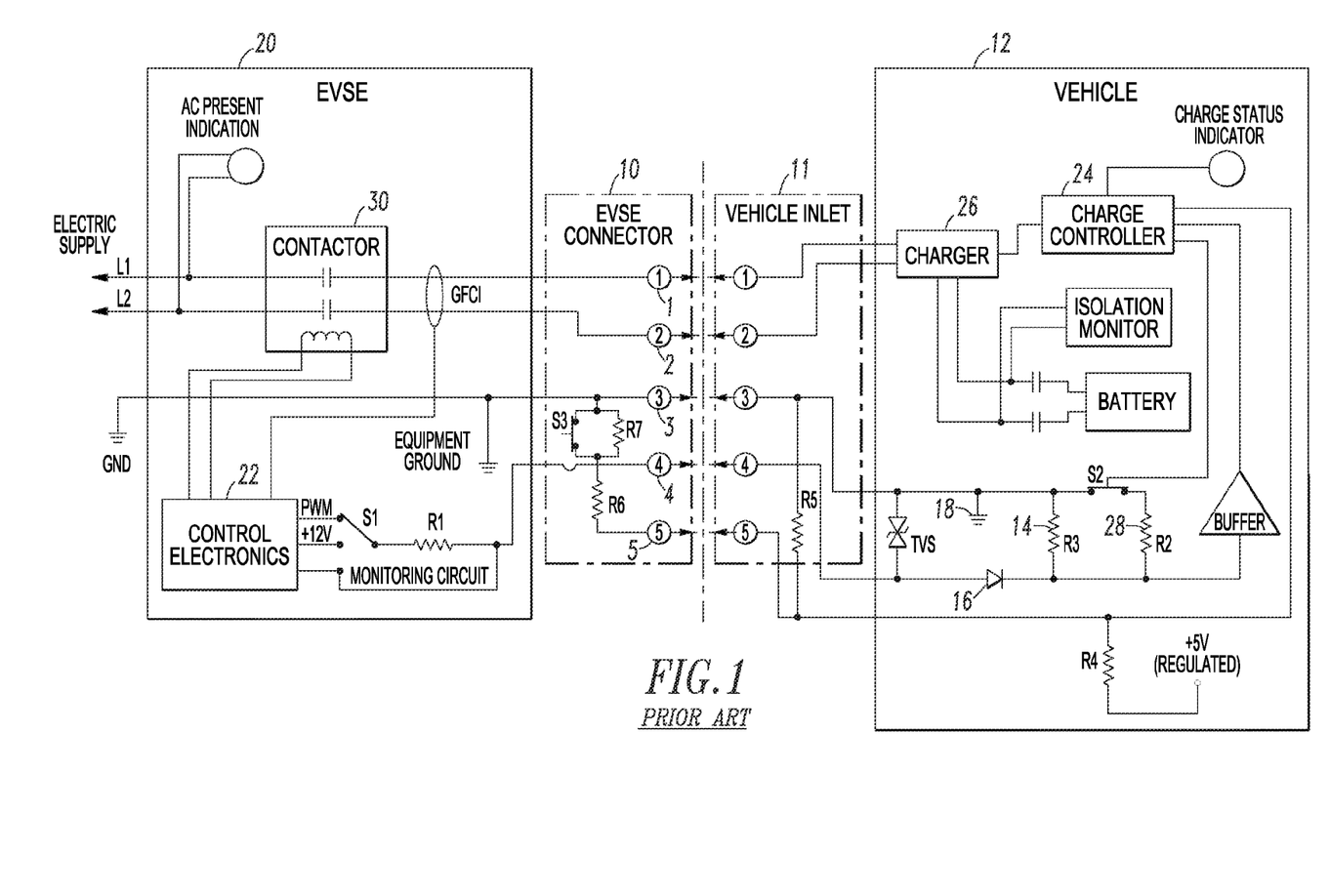
FIG. 1 is a block diagram in schematic form of an electric vehicle supply equipment (EVSE) to electric vehicle (EV) system having a pilot pin as defined by J1772.

If the EV inlet voltage is >0 at voltage sensor 166, if the EVSE state is not ReadyToCharge (i.e., the pilot pin 4 of FIG. 1 is 9 Vdc), and if the EV inlet voltage is 120 Vac and the PWM current indication is <20 A at PWM sensor 172, then indicate at 170 that INTERLOCK_NOT_IMPLEMENTED_BUT_OK.

Otherwise, indicate that: INTERLOCK_FAILED_AND_REQUIRED, and recommend fixes or causes: INTERLOCK_FAILED_AND_REQUIRED.

If the EVSE state is ReadyToCharge (i.e., the pilot pin 4 of FIG. 1 is 6 Vdc), and if the EV inlet voltage is 208 Vac or 240 Vac, then indicate that: INTERLOCK_IMPLEMENTED_AND_REQUIRED.

Otherwise, if the EV inlet voltage is 120 Vac and the PWM current indication is <20 A, then indicate that: INTERLOCK_IMPLEMENTED_BUT_NOT_REQUIRED, and indicate: CONGRATULATIONS_DEVICE_SAFE.

Figure 5:
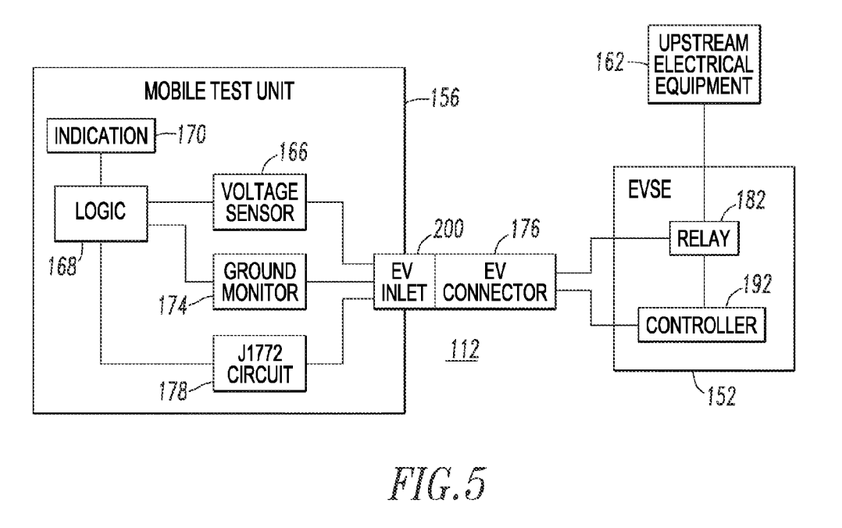
FIG. 5 is a block diagram of the wiring check function of FIG. 2.

FIG. 5 shows the wiring check function 112 of FIG. 2. This provides detection and remediation when the EVSE 152 manufacturing, installation, or site wiring is incorrect and includes: (1) crossed wires (i.e., L1, L2, ground, and neutral if needed); and (2) ground not present. By employing a combination of the number of voltage sensors 166 and a ground monitor 174, this detects common mis-wiring and site wiring issues for the EVSE 152 (see, for example, U.S. Pat. No. 7,518,840). Furthermore, in accordance with the disclosed concept, the function 112 provides feedback for the cause or fix of the wiring problem rather than just providing an all-pass or fail/not-all-pass indication.

If the EVSE 152 is powered by 120 Vac, and if L1 and N are swapped during installation (L1 and N should be wired to pins 1 and 2 as shown in FIG. 1, respectively, on the EV connector 176), the number of voltage sensors 166 from pin 1 (Hot1) to pin 3 (ground) and pin 2 (Hot2 or neutral) to pin 3 (ground) will detect this. Likewise, if the ground pin 3 has a voltage (e.g., a hot wire swapped with the ground wire), the J1772 circuit 178 will show much higher voltages than normal. In addition, by employing the human input 126 (FIG. 2), the EVSE test system 150 (FIG. 3) can tailor its response to a higher probability for the actual problem by gathering data accessible by a user (e.g., an open hot; an open ground).

In some conventional EVSEs, a "ground monitoring system" indicates when the ground line has a predefined amount of impedance. However, under the disclosed concept, the EVSE test system 150 (FIG. 3) preferably indicates remediation tactics (e.g., without limitation, verifying the ground wire installation; tightening the ground lug; checking the site ground; or other suitably statistically relevant causes for the data).

The wiring check function 112 can be installed in the separate mobile test unit (MTU) 156 or can be implemented into the EVSE 152 itself as a self-commissioning or self-check function.

Example 2

One example of the logic 168 of FIG. 5 is as follows.

If the EVSE state is ReadyToCharge (i.e., the pilot pin 4 of FIG. 1 peak is 6 Vdc), and if the voltage between pin 1 and pin 2 is 120 Vac, and if the voltage between pin 2 and pin 3 is 120 Vac, and the voltage between pin 1 and pin 3 is 0 Vac as determined by the number of voltage sensors 166, then recommend fixes or causes: HOT_AND_NEUTRAL_ARE_REVERSED. This covers the case for a U.S. based single phase 120 Vac system in which Hot1 and neutral are crossed due to a faulty installation or manufacturing. Neutral and ground being reversed cannot be detected.

Otherwise, if the voltage between pin 1 and pin 2 of FIG. 1 is 230 Vac, and if the voltage between pin 2 and pin 3 is 230 Vac, and if the voltage between pin 1 and pin 3 is 0 Vac as determined by the number of voltage sensors 166, then recommend fixes or causes: HOT_AND_NEUTRAL_ARE_REVERSED. This covers the case for 230 Vac IEC areas using one phase of a three-phase system, Hot1 and neutral are crossed, and there is a faulty installation or manufacturing. Neutral and ground being reversed cannot be detected.

Otherwise, if the voltage between pin 1 and pin 3 of FIG. 1 is greater than 0 Vac, and the voltage between pin 2 and pin 3 is 0 Vac, and the voltage between pin 1 and pin 2 is 0 Vac as determined by the number of voltage sensors 166, then recommend fixes or causes: OPEN_LINE2 for an open neutral or hot line 2.

If the voltage between pin 5 and pin 3 of FIG. 1 is greater than 5 Vdc or Vac as determined by the number of voltage sensors 166, then recommend fixes or causes: HIGH_VOLTAGES_DETECTED_ON_GROUND. This covers the case for the Hot1 and ground crossed being detected by the voltage on the proximity pin 5 being higher than 5 Vdc as sourced by the MTU 156 or other vehicle, simulated or real.

If the EVSE pilot pin 4 of FIG. 1 state is off (0 Vdc) and if the EVSE is visually indicating that it is "on" as verified by an operator or by a connection to the EVSE processor, then recommend fixes or causes: OPEN_GROUND or PILOT_SIGNAL_PROBLEM.

Otherwise, if the EVSE's true status is "off" (e.g., verified visually by an operator or otherwise), then recommend fixes or causes: EVSE_NOT_ON. This may arise from an open hot line, a product failure or another suitable statistically relevant cause.

Figure 6:
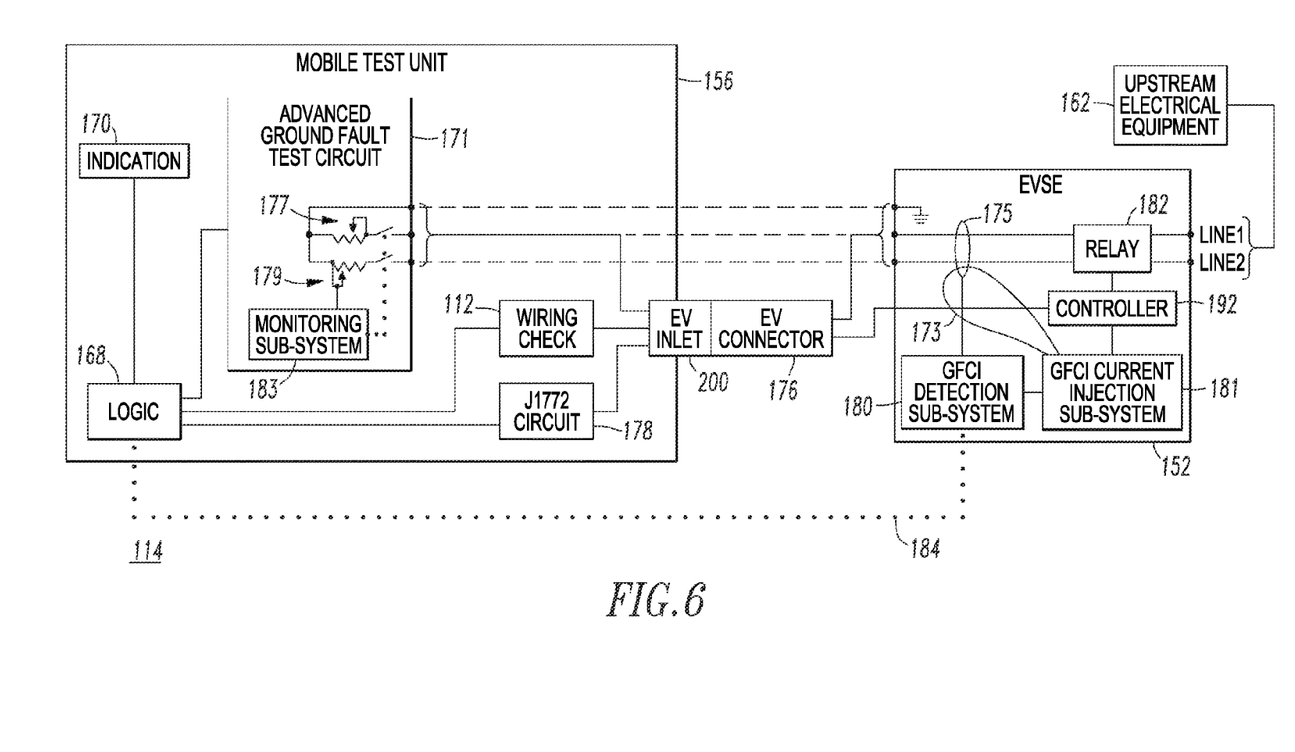
FIG. 6 is a block diagram of the ground fault troubleshooting check function of FIG. 2.

FIG. 6 shows the ground fault (GF) test circuit function 114 of FIG. 2. This provides an indication of EVSE ground fault circuit interrupter (GFCI) 180 protection not working and its relationship to incorrect wiring, power line noise, and/or faulty EVSE 152 subcomponents (e.g., without limitation, current transformers (CTs) (not shown); wiring; GFCI 180). This expands upon the wiring check function 112 of FIG. 5 and includes other sub-systems that are involved in the ground fault detection function, which is one of the key responsibilities of the EVSE 152.

Known EVSE controllers, such as 192, include a GFCI test current injection conductor 173, which is fed through the EVSE GFCI detection device (e.g., a GFCI CT 175), and logic 181 that tests the EVSE GFCI detection device 175 before the EVSE 152 relay 182 closes to ensure that the EVSE GFCI detection device 175 can detect a ground fault if one was to happen. This is one known method to meet the requirements of UL2594 to allow an automatic reset after a ground fault.

Known test fixtures utilize a suitable resistor and a switch 177 to simulate the imbalance of current that flows through Line 1 (pin 1 of FIG. 1) versus Line 2 (pin 2 of FIG. 1) under a simulated ground fault condition by causing current to flow from Line 1 to ground.

The disclosed GF test circuit function 114 adds a second resistor and switch 179 such that this can independently test both potentially hot legs (Line 1 and Line 2) from the EVSE 152. This uses two resistors rather than voltage sensors. Also, the two resistors are preferably variable in order to record and verify the accuracy and trip settings of the EVSE GFCI detection device 175 by the monitoring sub-system 183.

If this GF test circuit function 114 has a connection to the EVSE 152, then the logic 168 can use data from the EVSE GFCI test current injection sub-system 181 and its GFCI detection circuit 180 to re-evaluate and adjust, if needed, the calibration settings of the EVSE GFCI detection device 180 (e.g., including a GFCI CT 175 that may drift with time and/or temperature) as shown by the feedback connection 184 (shown in dotted line drawing) to the logic 168.

Example 3

One example of the logic 168 of FIG. 6 is as follows. This logic 168 is run while a function checks that specified GFCI 180 trip values (for pin 1 and pin 2 of FIG. 1) are not within specification. The logic 168 continually loops back through the logic to make sure that the EVSE 152 is in compliance, attempts to self heal, and if it never gets to the specified values, then exits with instructions to fix the statistically most likely cause of the problem (e.g., the EVSE GFCI 180 (board and CTs)).

If the EVSE state is CHARGING, which is true when the EVSE relay/contactor 182 is closed, then a function is run that causes a growing variable ground fault and that records the current and time at which the EVSE GFCI 180 detected the ground fault. Since the cause was an intentional ground fault on pin 1 of FIG. 1, which was detected by the EVSE 152, then the logic 168 waits until the EVSE state returns to CHARGING. The next step is to run the same function on pin 2 that causes a growing variable ground fault and record the current and time at which the EVSE GFCI 180 detects the ground fault. Since the cause was an intentional ground fault on pin 2, which was detected by the EVSE 152, then the logic 168 indicates: GFCI_WORKS.

Otherwise, if the cause was not an intentional ground fault on pin 2 of FIG. 1, and if the wiring check function 112 (FIG. 5) indicates that the EVSE 152 has a neutral, then the logic 168 indicates: GFCI_WORKS.

Otherwise, if the EVSE 152 does not have a neutral, then the logic 168 recommends fixes or causes: GFCI_FAILED_ON_LINE2.

Otherwise, if the cause was not an intentional ground fault on pin 1 of FIG. 1, then the logic 168 recommends fixes or causes: GFCI_FAILED_ON_LINE1.

Whenever the above full test occurs, then a compliance check and readjustment is performed by a feedback loop if a connection of the EVSE 152 to the EVSE GFCI 180 system exists. The feedback loop would exist when the ground fault test circuit function 114 is included in the EVSE 152 construction or when a connection is made through a physical upgrade port (not shown) or a network connection (not shown).

The feedback loop and readjustment records at least the following information: (a) EVSE last fault on pin 2 of FIG. 1—(1) actual ground fault trip current; (2) measured trip time; (3) actual trip time; and (b) EVSE last fault on pin 1 of FIG. 1—(4) actual ground fault trip current; (5) measured trip time; and (6) actual trip time. Using this information ((1)-(6)) that was garnered by the ground fault test circuit function 114 and compared by the GFCI test current injection sub-system 181, the GFCI detection 180 can now recalibrate based on experienced (e.g., third party) data versus measured (internal) data.

If the number of loops of adjustment exceeds a predetermined limit, then the loop exits because it is not fixing the calibration problem and recommends fixes or causes: GFCI_SYSTEM_NOT_SELF_HEALING.

Figure 7:
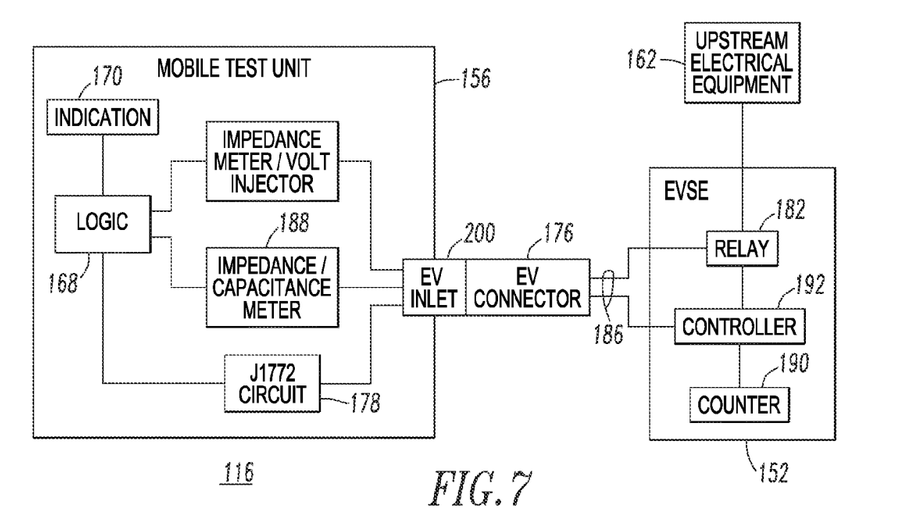
FIG. 7 is a block diagram of the cable health function of FIG. 2.

FIG. 7 shows the cable health check function 116 (e.g., without limitation, based on length; impedance; capacitance; number of times unit has been used; percentage of ground faults per plug session) that predicts insulation and conductor integrity.

The EVSE cable 186 and the EVSE connector 176 are the most prone parts of the EVSE 152 to be damaged (e.g., without limitation, by being run over; not being maintained properly; not being cared for (e.g., dropped; laying on the ground); general wear and tear in an outdoor environment). The EVSE cable 186, however, is the most prone to undetected damage because of its length (e.g., anywhere from about 9 to 25 feet) and color (e.g., generally black). The cable health check function 116 employs electrical and physical properties to give a score to the integrity of the EVSE cable 186, in order to protect users, increase up-time, and prevent non-scheduled maintenance.

When the cable health check function 116 is integrated into the mobile test unit (MTU) 156 as shown in FIG. 7, electrical aspects, such as impedance and capacitance are measured by meter 188 during or directly after undergoing a variety of tests (e.g., injecting a suitably high voltage potential onto the EVSE cable 186 while the J1772 circuit 178 has the EVSE relay 182 open). The logic 168 looks for a suitably low impedance or a suitably high capacitance indicating a potential insulation compromise and indicates the statistical chance of failure and the remediation steps.

When the cable health check function 116 is integrated into the EVSE 152, data from a ground fault and/or a plug session counter 190 is included in the logic 168 to further indicate to the owner, technician, or manager the statistically most likely action to remediate the pending problem.

Figure 8:
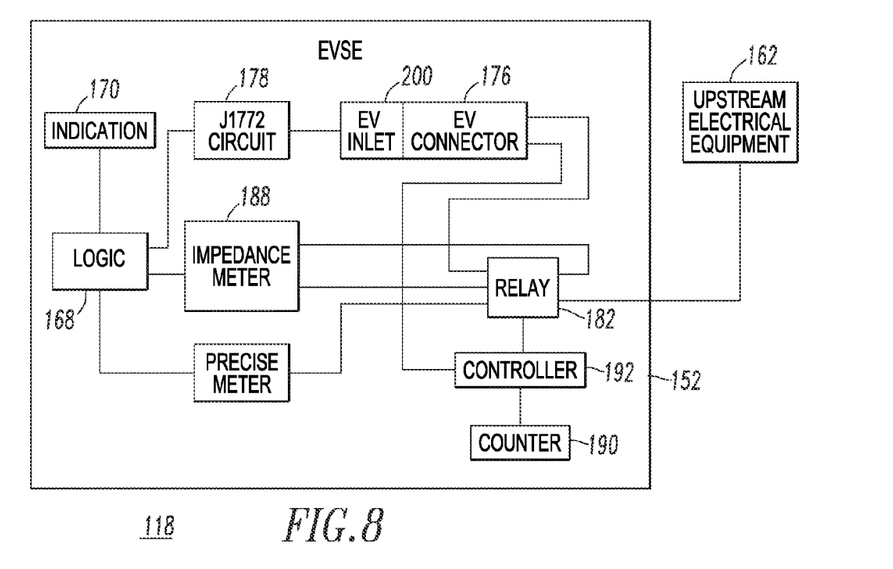
FIG. 8 is a block diagram of the contactor/relay health function of FIG. 2.

FIG. 8 shows the contactor/relay health check function 118 based on a number of uses and resistive and power quality inspection during opening and closing in order to predict when a service/replacement should happen. This function 118 is preferably integrated into the EVSE 152. Every relay or contactor, such as 182, used as the device that breaks the charging circuit has a life expectancy usually measured in terms of number of mechanical and electrical operations. The mechanical life is based on the material strength used within the device, while the electrical life has more to do with electrical conductance. Based on the material and coatings used by the contacts (not shown) of the relay 182, the arc of the circuit it breaks can clean the contacts. However, when a circuit is broken under no load, there is no arc and, hence, the contacts may buildup non-conductive contaminates. Also, if the mating contacts are not squarely aligned, chattering may occur if the mechanical strength of the internal spring (not shown) is too strong for the electromagnetic pull closing the activation arm (not shown) connecting to the contacts. Using these interactions along with an interlock control/status built into the EVSE controller 192, the contactor/relay health check function 118 tracks the number of operations of both under-load and non-load opening events of the relay 182. Based on a preprogrammed number of operations and a desired maintenance cycle, the EVSE 152 can score health based on how much of the life of the relay 182 has been used up, thereby allowing field personnel to be notified ahead of a statistical likely failure. Contactor health also can actually provide internal remediation if too many non-load openings have occurred, thereby forcing the contacts (not shown) of the relay 182 to be cleaned under load in a controlled way.

Also, by employing impedance and waveform capture of sub-cycle power quality during opening and closing of the relay 182, pitting or scaring of the contact surface can be detected. These values and data points can also be applied to an overall score of health of the relay/contactor 182, thereby showing a closer approximation to the time to failure. This data is be suitably indicated (and/or remediation action taken) when appropriate.

Figure 9:
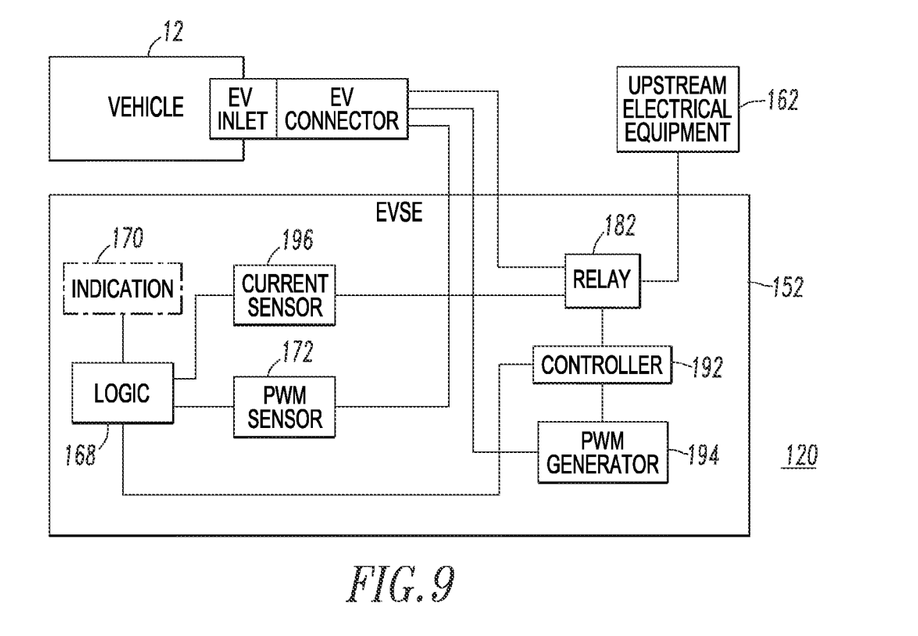
FIG. 9 is a block diagram of the pilot inspection and feedback function of FIG. 2.

FIG. 9 shows the pilot inspection function 120 that provides pilot inspection and feedback for the EVSE PWM pilot signal of pin 4 of FIG. 1 and adjustment for component drift. Without this function, the EV 12 could potentially pull more current than allowed if it incorrectly reads the PWM pilot signal. With this function 120, internal compensation still allows charging to happen, but at an apparent lower amperage that translates to the EV 12 at the correct safe amperage of the charging circuit.

The EV 12 knows the maximum amount of current that is able to be drawn from the EVSE charging station by the generated duty cycle of the PWM pilot signal on the pilot pin 4 of FIG. 1 as defined by J1772. The longer the upper side of the PWM square wave is at the proper positive voltage level, then the more current the EV 12 knows it can pull (as defined by J1772). However, depending on how the EV 12 detects the duty cycle, there is a possibility that an incorrect reading of the PWM square wave could be detected by, for example and without limitation, an aged or faulty detection circuit (of the charge controller 24 of FIG. 1) and, thereby, pull more current than the EVSE charging station was designed to handle. This could either cause an error or make components work outside of their intended ranges.

If built into the EVSE 152, as shown in FIG. 9, the pilot inspection function 120 permits the charging process to continue without causing an error condition by creating a closed loop mechanism. By sensing the EVSE-generated PWM signal from PWM generator 194 and the amount of current that the EV 12 is actually pulling as sensed by current sensor 196, the pilot inspection function logic 168 adjusts the EVSE PWM generator 194 through controller 190 down to a suitable lower duty cycle that, in turn, is detected by the EV 12 as an actual current that is safe for the EVSE charging station. This dynamic, closed loop mechanism is employed because this problem may only apply to a specific vehicle or to a specific make of vehicle.

When the pilot inspection function 120 is built into an external box as an adapter (e.g., 160 of FIG. 2) or mobile test unit (e.g., 156 of FIG. 2), an indication at 170 of the cause and source of the problem (e.g., EV detection of wrong PWM; EVSE generation of incorrect values) can be transmitted, displayed or otherwise indicated for use by, for example, service or maintenance personnel.

Example 4

The EVSE PWM generator 194 is set to an example 25% duty cycle, which coincides with a maximum current of 15 A (J1772 2011-01 uses the equation "Available Amps=(% duty cycle)*0.6" for duty cycles of 10% to 85%). When the EV 12 plugs-in and reads the PWM pilot signal, it detects a 29% duty cycle because of a faulty operational amplifier (not shown) in the EV PWM detection circuit (part of the charge controller 24 of FIG. 1), which coincides with 17.4 A (17.4=29*0.6). The EV 12 generally pulls the highest amperage that it can, so in this case it will draw 17.4 A on the example 15 A EVSE 152. If the EVSE 152 has built-in overcurrent protection, then the EVSE 152 likely trips open immediately, retries, and fails again resulting in no charge. If the EVSE 152 does not employ overcurrent protection, then the EVSE 152 will operate at over 17 A. If the EVSE 152 was designed to 15 A maximum, then 17.4 A may not cause an immediate safety challenge, however this could lead to a shortened life of internal wire insulation and reduced health of the relay/contactor 182 over time.

If the EVSE 152 includes the pilot inspection function 120, as shown in FIG. 9, then the EVSE current sensor 196 senses the current that exceeds the nominal 15 A maximum current, informs the logic 168, and the logic 168 redirects the controller 190 and, thus, the PWM generator 194 to change the PWM duty cycle to a suitable lower PWM setting until the EV 12 pulls the correct amperage. Since the EV 12 is pulling 16% more current than the EVSE 152 rating, it may be counteracted by the EVSE 152 changing the PWM signal duty cycle down 16%, to a PWM of 21% ((25−25*0.16)=21). This would then be interpreted by the example EV PWM detection circuit (part of the charge controller 24 of FIG. 1) to be 25%, and would therefore pull the correct maximum 15 A current.

Referring to FIG. 10, the example EVSE test apparatus is placed in the "dock" and/or storage place 158 of the EVSE connector 176 in order to manually or automatically test the EVSE 152 every time the EVSE cable 186 and EVSE connector 176 is stored properly.

Known testing systems for EVSE are believed to involve a device to use after installation, during maintenance, or for troubleshooting an existing problem. The disclosed concept replaces these occasional test systems and places the example EVSE test system 198 in a suitable place, the example "dock" and/or storage place 158 of the EVSE connector 176 and/or cable 186. This embodiment enables a relatively simple J1772 circuit test, or for more data, some or all of the tests, as disclosed herein, to occur every time the EVSE 152 is not in use by a suitable manual or automatic mechanism.

Example 5

One example implementation of the EVSE test system 198 integrated in the "dock" and/or storage place 158 is shown in FIG. 10 with the J1772 EV connector 176 in the EV inlet 200. The example dock 158 includes a test button 202 having an indicator 204, and a conventional J1772 vehicle circuit 206 including a resistor having a resistance equivalent to the resistance of the parallel resistors 14,28 and series diode 16 of FIG. 1. When the J1772 EV connector 176 is docked, a user simply presses the test button 202, which engages the J1772 vehicle circuit 206 to pin 3 and pin 4 of FIG. 1 to simulate a charging event for the EVSE 152. The test button indicator 204 lights when the EVSE 152 is engaged in charging, thereby indicating that the EVSE 152 is fully functional. This provides an important function that is believed to solve an important need in figuring out what caused the problem—the EV 12 (FIG. 1) or the EVSE 152 for 20 of FIG. 1)—because the charging circuit is split between these two components. Here, the user can immediately test the EVSE 152 to confirm its functionality and to rule it out as being the cause of the problem. The disclosed concept, thus, integrates the EVSE test system 198 into the example dock 158 and can be connected back into the EVSE controller 190 for full feedback response.

The output instructions and conclusions function 122 of FIG. 2 depends on the particular embodiment, but can be provided by any suitable visual or auditory indicators, such as 170 (FIGS. 4-9), including, for example and without limitation, computer messages, home area network messages, computer programs, on-device, plug-in screen or any suitable display. The output indications of the problems, troubleshooting instructions, or auditory messages of the EVSE test circuit 100 (FIG. 2) or EVSE test system 198 (FIG. 10) can include, for example and without limitation, blinking visual patterns, symbols, actual words or sentences on a built-in or removable/attachable display on the device, or shown through third party devices, such as computers, phones, tablets, or other electronic-based devices that are fixed or mobile.

The logic 124 (FIG. 2) or 168 (FIGS. 4-9) for the EVSE test circuit 100 (FIG. 2) or EVSE test system 198 (FIG. 10) depend on the particular embodiment, but can be provided by any suitable processor (e.g., without limitation, microprocessor based embedded system firmware; a local processor; an analog circuit; a remote networked controller to aggregate data from multiple sources to make better statistical judgments and suggestions).

The human input 126 of FIG. 2 includes any suitable user interface circuit that confirms the accuracy of the EVSE test circuit 100 (FIG. 2) or EVSE test system 198 (FIG. 10) output, and feeds into the logic 124 (FIG. 2) or 168 (FIGS. 4-9) for the next output. This can consist of, for example and without limitation, a simple yes or no response, or actual adjustment of the logic. Programming, logic, and all machine-programmed instructions are only as good as they were initially designed or constructed. It is always beneficial to have a way to cross-check, verify, or adjust the work product. This places human intelligence in the test loop with a potentially greater awareness of what is going on by asking simple questions that no sensor or test can answer as easily or as economically. Ultimately, human input from one EVSE test device can help all the network enabled EVSE test devices on a network since the EVSE test devices can "learn together".

Example 6

For instance, certain problems may arise from the physical location or part of the world where the product is installed. Each EVSE 152 can have an internal GPS capability, a user interface or other suitable input capability to input where the unit was installed. This data can be statistically analyzed, either locally or remotely, to see if there is any correlation with certain problems or maintenance issues. Similarly, to confirm that the recommendation is the correct one, before displaying a troubleshooting message or a likely cause of an issue that the EVSE test circuit 100 (FIG. 2) or EVSE test system 198 (FIG. 10) has tested for, several simple questions can be asked that better confirms or potentially refutes the recommendation, thereby potentially changing the likelihood that it is the right recommendation and giving a different output. Lastly, rather than just inputting information, and follow-up confirmation questions, the human input 126 can be employed to change the course of action by the system by asking the human user how to best respond by adjusting the logic 124 (FIG. 2) or 168 (FIGS. 4-9) itself.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A test apparatus for electric vehicle supply equipment, said test apparatus comprising:
   an enclosure;
   a processor; and
   an interface to at least said electric vehicle supply equipment,
   wherein said processor is structured to test that said electric vehicle supply equipment is functioning properly and to provide at least one of: automatic correction of a failure of said electric vehicle supply equipment, and predictive maintenance of said electric vehicle supply equipment prior to a failure thereof.

2. The test apparatus of claim 1 wherein said processor is further structured to test that wiring operatively associated with said electric vehicle supply equipment is correct, and to indicate a number of remediation tactics if said wiring is incorrect.

3. The test apparatus of claim 1 wherein said interface comprises a state switch; and wherein said processor is further structured to test whether said electric vehicle supply equipment provides a power interlock in response to said state switch.

4. The test apparatus of claim 1 wherein said electric vehicle supply equipment comprises an electric vehicle connector and an electric vehicle cable; and wherein said processor is further structured to test said electric vehicle connector and said electric vehicle cable.

5. The test apparatus of claim 1 wherein said electric vehicle supply equipment comprises a relay or contactor; and wherein said processor is further structured to provide predictive maintenance of said relay or contactor.

6. The test apparatus of claim 1 wherein said enclosure is an enclosure of a device electrically connected between said electric vehicle supply equipment and an electric vehicle.

7. The test apparatus of claim 1 wherein said electric vehicle supply equipment comprises an electric vehicle connector and an electric vehicle cable; and wherein said enclosure is structured to store at least one of said electric vehicle connector and said electric vehicle cable.

8. The test apparatus of claim 1 wherein said enclosure is a mobile test unit enclosure.

9. The test apparatus of claim 1 wherein said enclosure is an enclosure of said electric vehicle supply equipment.

10. The test apparatus of claim 1 wherein said enclosure is an enclosure of a protective device upstream of said electric vehicle supply equipment.

11. The test apparatus of claim 1 wherein said enclosure is an enclosure of an electric vehicle.

12. The test apparatus of claim 1 wherein said processor is further structured to combine information from a plurality of tests of said electric vehicle supply equipment to adjust a number of causes of the failure of said electric vehicle supply equipment, and an indication of how to correct said failure.

13. The test apparatus of claim 1 wherein said processor is further structured to combine information from a number of other electric vehicle supply equipment test apparatus to adjust a number of causes of the failure of said electric vehicle supply equipment, and an indication of how to correct said failure.

14. The test apparatus of claim 1 wherein said electric vehicle supply equipment comprises an output having a pulse width modulated signal structured to indicate current capacity of said electric vehicle supply equipment; and wherein said processor is further structured to test said output.

15. The test apparatus of claim 14 wherein said electric vehicle supply equipment further comprises a pulse width modulated generator structured to output said pulse width modulated signal, and a current sensor structured to output a sensed current signal to said processor; and wherein said processor is further structured to adjust a duty cycle of said pulse width modulated signal as output by said pulse width modulated generator, and to control said pulse width modulated generator until a predetermined value of said sensed current signal is sensed.

16. The test apparatus of claim 14 wherein said interface is electrically connected between said electric vehicle supply equipment and an electric vehicle; and wherein said processor is further structured to indicate a cause and a source of a failure operatively associated with said pulse width modulated signal output to said electric vehicle.

17. The test apparatus of claim 1 wherein said processor comprises an output to indicate a number of causes of failure of said electric vehicle supply equipment, an indication of how to correct said failure, and an indication of the predictive maintenance of said electric vehicle supply equipment.

18. The test apparatus of claim 17 wherein said processor comprises an input structured to receive user input to confirm accuracy of said output.

19. A test apparatus for electric vehicle supply equipment comprising a relay or contactor, a pulse width modulated generator structured to output a pulse width modulated signal, and a ground fault protective device having calibration settings, said test apparatus comprising:
   an enclosure;
   a processor; and
   an interface to at least said electric vehicle supply equipment,
   wherein said processor is structured to test that said electric vehicle supply equipment is functioning properly and to provide predictive maintenance of said relay or contactor.

20. A test apparatus for electric vehicle supply equipment comprising an electric vehicle charging connector and an electric vehicle charging cable, said test apparatus comprising:
   a processor;
   an interface to at least said electric vehicle supply equipment; and
   an enclosure enclosing said processor and said interface,
   wherein said processor is structured to test said electric vehicle supply equipment, and
   wherein said enclosure further encloses both said electric vehicle charging connector and said electric vehicle charging cable.

* * * * *